(12) United States Patent
Russell et al.

(10) Patent No.: US 6,645,872 B2
(45) Date of Patent: Nov. 11, 2003

(54) CHEMICALLY ENHANCED FOCUSED ION BEAM MICRO-MACHINING OF COPPER

(75) Inventors: Phillip E. Russell, Apex, NC (US); Dieter P. Griffis, Morrisville, NC (US); Juan Carlos Gonzales Perez, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 10/284,784

(22) Filed: Oct. 31, 2002

(65) Prior Publication Data

US 2003/0060048 A1 Mar. 27, 2003

Related U.S. Application Data

(62) Division of application No. 09/871,541, filed on May 31, 2001, now Pat. No. 6,514,866.
(60) Provisional application No. 60/261,109, filed on Jan. 12, 2001.

(51) Int. Cl.[7] .............................................. H01L 21/302
(52) U.S. Cl. ...................................... 438/712; 438/738
(58) Field of Search ................................ 438/712, 714, 438/720, 723, 738; 216/66, 72, 78

(56) References Cited

U.S. PATENT DOCUMENTS

| | | | |
|---|---|---|---|
| 5,188,705 A | * | 2/1993 | Swanson et al. ........ 204/192.34 |
| 5,221,422 A | * | 6/1993 | Das et al. ..................... 216/57 |
| 5,766,379 A | | 6/1998 | Lanford et al. ............. 148/537 |
| 5,798,529 A | | 8/1998 | Wagner .................... 250/492.2 |
| 5,899,740 A | | 5/1999 | Kwon ......................... 438/627 |
| 5,958,799 A | * | 9/1999 | Russell et al. ............... 438/712 |
| 5,959,358 A | | 9/1999 | Lanford et al. ............. 257/762 |
| 6,057,223 A | | 5/2000 | Lanford et al. ............. 438/618 |
| 6,083,413 A | * | 7/2000 | Sawin et al. ................ 216/104 |
| 6,140,655 A | | 10/2000 | Russell et al. ........... 250/492.2 |
| 6,322,672 B1 | * | 11/2001 | Shuman et al. ........ 204/192.34 |

OTHER PUBLICATIONS

Hariharaputhiran et al., *Hydroxyl Radical Formation in $H_2O_2$–Amino Acid Mixtures and Chemical Mechanical Polishing of Copper*, Journal of the Electrochemical Society, vol. 147, No. 10, Oct. 2000, pp. 3820–3826.

Phillips et al., *Channeling Effects During Focused–IonBeam Micromachining of Copper*, J. Vac. Sci. Technol. A, 18(4), Jul./Aug. 2000, pp. 1061–1065.

Thaus et al., *Development of Focused Ion–Beam Machining Techniques for Permalloy Structures*, J. Vac. Sci. Technol B, 14(6), Nov./Dec. 1996, pp. 3928–3932.

* cited by examiner

*Primary Examiner*—Kin-chan Chen
(74) *Attorney, Agent, or Firm*—Myers Bigel Sibley & Sajovec

(57) ABSTRACT

A method of micromachining a copper layer on a substrate is carried out by maintaining the substrate in a vacuum, bombarding a portion of the substrate with a focused particle beam from a particle source, and exposing the substrate to a supply of organic chloride or hydroxide during particle bombardment. The organic chloride or hydroxide concentration at the substrate is an amount sufficient to enhance the relative removal of the copper layer by decreasing the removal of the dielectric or increasing the removal of the copper or a combination of both.

20 Claims, 4 Drawing Sheets

CHEMICALLY ENHANCED FOCUSED ION BEAM MICRO-MACHINING OF COPPER

CROSS-REFERENCE TO RELATED APPLICATION

This application is a divisional of application Ser. No. 09/871,541, filed May 31, 2001, now U.S. Pat. No. 6,514, 866, entitled Chemically Enhanced Focused Jon Beam Micro-Machining Of Copper, assigned to the assignee of the present application, the disclosure of which is hereby incorporated herein by reference in its entirety as if set forth fully herein.

RELATED APPLICATIONS

This application claims the benefit of U.S. provisional application serial No. 60/261,109 of P. Russell, D. Griffis and J. Gonzales Perez, filed Jan. 12, 2001, the disclosure of which is incorporated by reference herein in its entirety.

FIELD OF THE INVENTION

The present invention concerns the focused ion beam machining of copper on substrates such as microelectronic substrates.

BACKGROUND OF THE INVENTION

Focused ion beam machining (FIBM) is required for design debug, editing and verification, metrology, and process control of nanofabricated devices such as microelectronic substrates. See, e.g., U.S. Pat. No. 5,188,705 to Swanson et al., U.S. Pat. No. 6,140,655 to Russell et al., and U.S. Pat. No. 5,798,529 to Wagner et al.

Unfortunately, the current knowledge base associated with the FIBM of aluminum does not directly transfer to copper micro-machining. Copper is notoriously difficult to micro-machine uniformly with a focused ion beam since the micro-machining rate depends heavily on Cu grain orientation. J. Phillips et al., *J. Vac. Sci. Technol* A 18, 1061 (2000); D. Thaus et al., *J. Vac. Sci. Technol.* B 14, 3928 (1996). Accordingly, there is a need for new ways to carry out the focused ion beam, or other particle beam, machining of copper.

SUMMARY OF THE INVENTION

A first aspect of the present invention is, accordingly, a method of micromachining a copper layer on a substrate. The method comprises: bombarding a portion of the substrate (particularly the copper layer) with a particle beam (e.g., a focused beam or charged particle beam) from a particle source; and exposing the substrate to a supply of organic chloride or organic hydroxide during particle bombardment, the organic chloride or organic hydroxide vapor concentration at the substrate being sufficient to enhance removal (including removal in whole or removal in part) of the copper layer. The substrate is preferably maintained in a vacuum during the bombarding and exposing steps. The vacuum need only be sufficient for achieving the intended purpose of micromachining the copper, and need not be absolute.

A second aspect of the present invention is a method of selectively removing a first, copper material from a substrate to expose a neighboring (underlying or adjacent) layer of a second material. The method comprises maintaining the substrate in a vacuum; bombarding with a particle beam (e.g, a focused beam or charged particle beam) a portion of the substrate having a first copper material neighboring a second material such as a dielectric; and exposing the portion of the substrate to an organic chloride or organic hydroxide during particle bombardment of the substrate, the first copper layer having a sputter etch rate that either 1) is increased by the presence of organic chloride or organic hydroxide vapor and the second material having a sputter etch rate that is not increased by the presence of organic chloride or organic hydroxide vapor to the degree that the sputter etch rate of the first material is increased, thereby selectively sputtering the first material compared with the second material; or is decreased by the presence of organic chloride or organic hydroxide vapor and the second material having a sputter etch rate that is decreased by the presence of organic chloride or organic hydroxide vapor to the degree that the sputter etch rate of the second material is decreased, thereby selectively sputtering the first material compared with the second material; or a combination of both. In one embodiment, the second material underlies the first material. In a particular embodiment, exposing the substrate to a supply of organic chloride or organic hydroxide includes exposing the substrate to organic chloride or organic hydroxide vapor at a partial pressure of approximately 1 mTorr. In one preferred embodiment, the particle beam comprises a beam of gallium ions focused to a sub-micron target point.

A further aspect of the present invention is a method of shaping features of a surface of a solid object having a surface. The method comprises the steps of: positioning the object within an enclosed chamber; supplying organic chloride or organic hydroxide vapor within the chamber so that organic chloride or organic hydroxide is adsorbed onto the exposed surface of the object for enabling a chemical reaction between the organic chloride or organic hydroxide and a copper layer at the surface; generating a particle beam (e.g., a focused beam or charged particle beam); and directing the beam toward the surface for removal by sputtering of a portion of the copper layer, the particle-beam induced chemical reaction between the organic chloride or hydroxide and the copper layer increasing the sputtering selectivity of the copper layer relative to the-neighboring layer and especially the underlying layer.

A still further aspect of the present invention is a method of chemically-enhanced particle beam machining of a copper layer on a substrate for cross-sectional analysis. The method comprises maintaining a substrate in a vacuum; applying an organic chloride or organic hydroxide to the substrate; and bombarding with a particle beam (e.g., a focused beam or charged particle beam) a portion of the substrate including thereon a copper layer to expose for examination a cross section of the copper layer. The organic chloride or organic hydroxide is applied to the substrate at a concentration sufficient to enhance removal of the copper layer.

Still further aspects of the present invention include the products which may be produced by the processes described herein.

The present invention also provides a focused particle beam metrology device. The device comprises: a particle beam (e.g., a focused particle beam or charged particle beam) source which produces low intensity focused particle beams directed to a semiconductor device having features thereon; a detector which detects electrons or ions emitted from the semiconductor device; a processor which receives data from the detector and measures dimensions of the features from the data; a discharge device which introduces an organic chloride or organic hydroxide toward the semiconductor device (the device preferably including a copper layer as described herein); and a control device connected to the particle beam device to vary intensity of the focused particle beams for generating high intensity focused particle beams to etch the semiconductor device. Preferably the detector is located substantially above the semiconductor device for top-down linewidth measurements. The device may include a display device connected to the processor, wherein the display device displays an image of the semiconductor device. The high intensity focused particle beams may partly or completely etch through the semiconductor device. In one embodiment, the high intensity particle beams etch a crater in the semiconductor device exposing a cross-section of the semiconductor device, and the low intensity particle beams scan the cross-section at a predetermined angle to form an image of the cross-section. The device may further include a movable platform for holding the semiconductor device, wherein the movable platform is tilted at the predetermined angle during the low intensity particle beam scanning of the cross-section.

In a particular embodiment of the foregoing, the present invention provides a method of forming a three dimensional profile of a copper feature of a semiconductor device, the method comprising the steps of: introducing an organic chloride or organic hydroxide toward the semiconductor device through a discharge device; etching a top surface of the feature with a high intensity focused particle beam from an particle beam source; forming a top-down image of the top surface on an image forming device connected to a processor; repeating the etching and forming steps until the feature is completely etched from top to bottom to form successive top-down images of the etched feature; and overlaying the top-down images of the feature by the processor to form the three dimensional profile of the feature.

In another particular embodiment of the foregoing, the present invention provides a method of measuring a cross-section profile of a copper layer of a semiconductor device which comprises the steps of: introducing an organic chloride or organic hydroxide toward the semiconductor device through a discharge device; etching a crater to expose the cross-section by a high intensity focused particle beam generated from a first particle beam source; directing a low intensity particle beam toward the cross-section; and forming an image of the cross-section on an image forming device from low intensity particle beams generated from the particle beam source and reflected from the cross-section.

The foregoing and other objects and aspects of the present invention are explained in greater detail in the drawings herein and the specification set forth below.

DETAILED DESCRIPTION OF THE PREFERRED EMBODIMENTS

Figure 1:
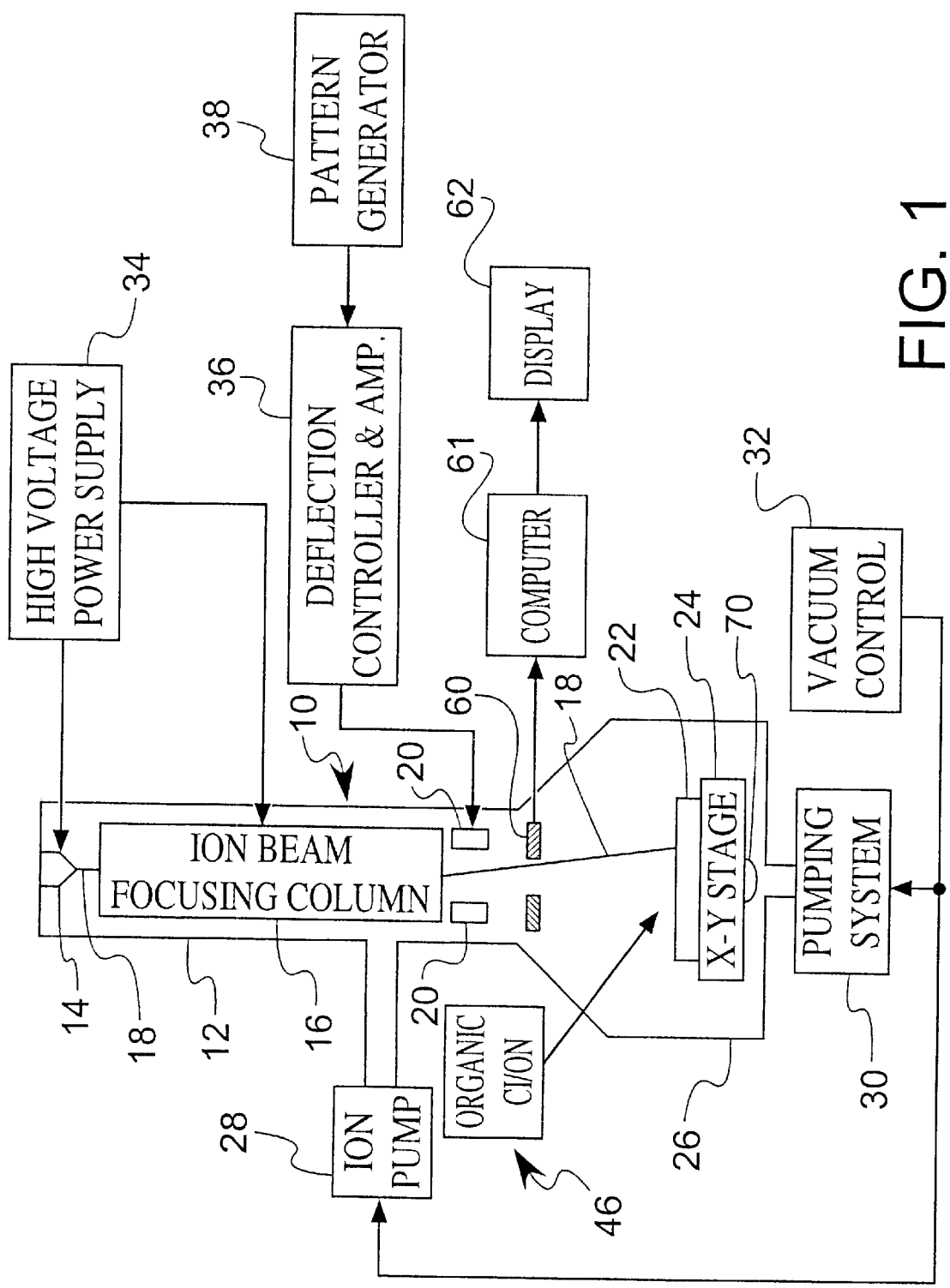
FIG. 1 is a schematic representation of a focused ion beam system adapted for carrying out the process of the present invention.

The present invention is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions may be exaggerated for clarity.

Focused particle beam machining is known and disclosed, for example, in U.S. Pat. No. 5,188,505 to Swanson et al., U.S. Pat. No. 6,140,655 to Russell et al., and U.S. Pat. No. 5,798,529 to Wagner et al., the disclosures of which are incorporated herein by reference. Any type of particle beam can be used, including electron beams and ion beams, with ion beams such as gallium ion beams being currently preferred.

"Organic hydroxide" as used herein refers to any carbon compound (that is, a compound with a carbon backbone) that contains one or more hydroxide radicals, including but not limited to C1 to C4, C6, or C8 (or more) compounds. "Organic chloride" as used herein refers to any carbon compound (that is, a compound with a carbon backbone) that is substituted one or more times with a chlorine atom, including but not limited to C1 to 4, C6, or C8 (or more) compounds. (The term "organic chloride" also includes compounds containing both chlorine and a hydroxide radical.) The organic chloride or organic hydroxide compounds may be linear or branched and saturated or unsaturated (e.g., containing one, two or more double bonds). The carbon backbone may also be substituted with one or more additional atoms such as hydrogen, or may be completely substituted with chloride and or organic hydroxide groups. The carbon backbone may consist entirely of carbon, but may optionally contain hetero atoms such as nitrogen, oxygen and/or sulfur. Preferably the organic chloride or organic hydroxide is one that may be introduced into the vacuum as a vapor. In a preferred embodiment, the organic chloride is $C_xH_yCl_z$, where x is 1 or 2 to 4, 6 or 8; y may be 0; z is at least 1 or 2; and the total of y and z is dependent upon the number of substituents available for the compound based upon x and the degree of branching and unsaturation of the carbon atoms in the molecule. Specific examples include, but are not limited to:

$C_2H_4Cl_2$ (dichloroethane), $C_2Cl_4$ (tetrachloroethene), $CCl_4$ (tetrachloromethane or carbon tetrachloride), $CHCl_3$ (trichloromethane or chloroform), $CH_2Cl_2$ (dichloromethane),
$C_2Cl_4$ (tetrachloroethene),
$C_2Cl_6$ (hexachloroethane),
$C_2HCl_3$ (trichlorethene),
$C_2HCl_5$ (pentachloroethane),
$C_2H_2Cl_2$ (cis 1,2 Dichloroethene),
$C_2H_2Cl_2$ (1,1 dichloroethene),
$C_2H_4Cl_2$ (1,2 dichlorethane),
$C_2H_2Cl_4$ (1,1,2,2 tetrachloroethane),
$C_2H_2Cl_4$ (1,1,1,2 tetrachlorethane),
$C_2H_3Cl_3$ (1,1,1 trichloroethane),
$C_2H_3Cl_3$ (1,1,2 trichlorethane).

In a preferred embodiment, the organic hydroxide is $C_xH_y(OH)_z$ where x is 1 or 2 to 4, 6 or 8; y may be 0; z is at least 1 or 2; and the total of y and z is dependent upon the number of substituents available for the compound based upon x and the degree of branching and unsaturation of the carbon atoms in the molecule. Specific examples include, but are not limited to:

$C_2H_5OH$ (ethanol),
$C_2H_4(OH)_2$ (dihydroxyethane),
$C_2H_3(OH)_3$ (trihydroxyethane),
$C_2H_2(OH)_4$ (tetrahydroxymethane),
$C_2H(OH)_5$ (pentahydroxymethane)
$C_2H(OH)_3$ (trihydroxyethene),
$CH_3OH$ (methanol),
$CH_2(OH)_2$ (dihydroxymethane),
$CH(OH)_3$ (trihydroxymethane), and
$C(OH)_4$ (tetrahydroxymethane).

Examination of the literature has found that hydroxide radicals have been reported to enhance the removal of copper during mechanical polishinng (M Hariharaputhiran et al., J. Electrochem. Soc. 147 (2000) 3820). The production of these during wet-chemistry, mechanical polishing requires the addition of an amino-acid to the slurry. This in no means indicates that the use of organic hydroxides would enhance the removal of copper during the dry-chemistry process of FIBM would enhance the relative etching of copper over $SiO_2$.

"Copper" as used herein refers to any type of copper material, including copper alloys, employed in semiconductor fabrication. The copper may be in or on any type of substrate, such as a semiconductor substrate or device. The copper layer may overlie a second material, typically a dielectric. Examples of dielectric materials include, but are not limited to, $SiO_2$, SiN, SiON, ON, ONO, BPSG, PSG, USG, etc. The copper layer may have a thin overlying or underlying layer between the copper layer and the underlying substrate or dielectric, such as a thin diffusion barrier, passivated layer, oxide layer or insulating layer. Examples of copper layers and substrates that may be the workpiece in the present invention include, but are not limited to, that shown in U.S. Pat. Nos. 6,057,223; 5,959,358; 5,899,740; and 5,766,379, the disclosures of which are incorporated by reference herein in their entirety.

Referring to FIG. 1, a focused particle beam system for selectively increasing the rate of removal of certain materials and decreasing (or relatively decreasing) the rate of removal of other materials according to the present invention is illustrated. An evacuated envelope 10 includes an upper neck portion 12 within which a liquid metal ion source 14 and a focusing column 16 are located. The particle beam 18 passes from the source 14 through the column 16 and between electrostatic deflectors 20 toward substrate or workpiece 22, which is positioned on a movable X-Y stage 24 within the lower chamber 26. The workpiece 22 can be any device or substance capable of being machined by a charged particle beam, including, but not limited to, microelectronic devices including semiconductors, optical devices, and any device having multi-layer coatings. An ion pump 28 is employed for evacuating the neck portion 12. The lower chamber 26 is evacuated with a pumping system 30 operated by a vacuum controller 32.

A high voltage power supply 34 is connected to the liquid metal ion source 14 as well as to electrodes (not shown) contained within the focusing column 16 for forming an approximately 25 keV particle beam 18 and directing the beam downwardly in the direction of the workpiece 22. The deflection controller and amplifier 36, which is operated in accordance with a prescribed pattern such as a raster pattern provided by the pattern generator 38, is coupled to the electrostatic deflection means 20, whereby the particle beam 18 can be controlled to sputter a pattern on the upper surface of the workpiece 22. In one embodiment, the liquid metal ion source 14 provides a beam of gallium ions, although other ions or particles could be used. In another embodiment, the particle beam 18 could comprise electrons.

For metrology applications and other detection steps, the device may also include a detector 60 operatively associated with a computer 61 or other processor, as well as a drive 70 for tilting the X-Y stage. The detector is located above the sample as noted previously. Computer 61 may be operatively associated with an imaging or display device 62 for displaying an image of the sample, or the image may simply be stored for future display. All may be implemented and or configured for measuring dimensions of the sample, as described in U.S. Pat. No. 5,798,529 to Wagner et al. (the disclosure of which is incorporated by reference herein in its entirety) with the addition of a organic chloride or organic hydroxide source as described herein.

Figure 2:
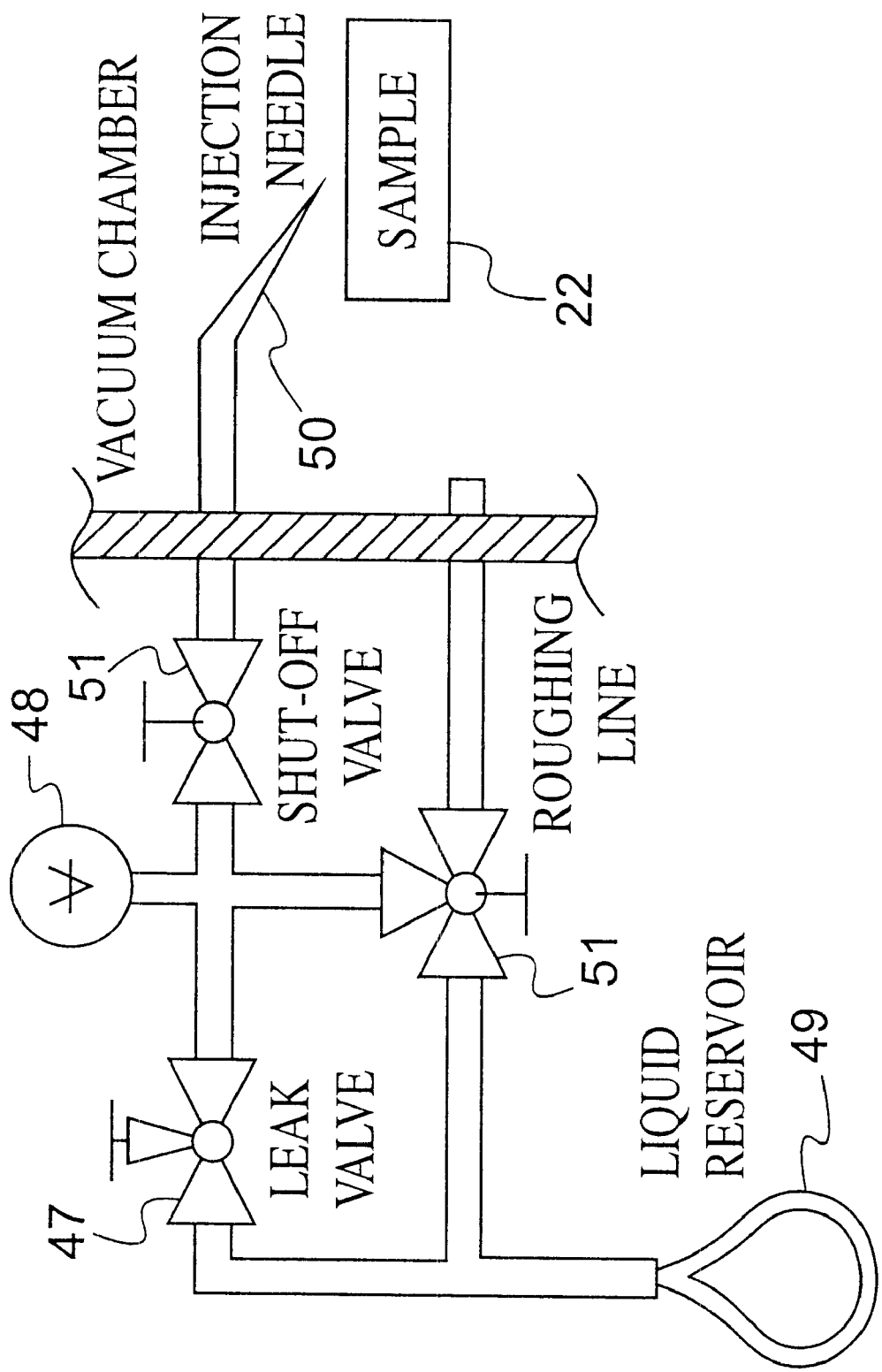
FIG. 2 is a schematic illustration of the gas injection system for providing organic chloride or organic hydroxide vapor.
Figure 3:
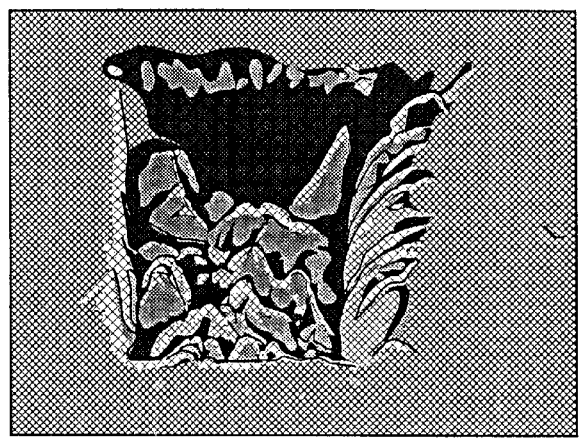
FIG. 3 shows an SEM micrograph, taken at 30 degrees tilt, of unassisted FIB machined copper with 25 keV Ga$^+$, 0.5 nA, 130 nm spot size; 50% beam overlap, 0.1 usec dwell time showing large induced topography.
Figure 4:
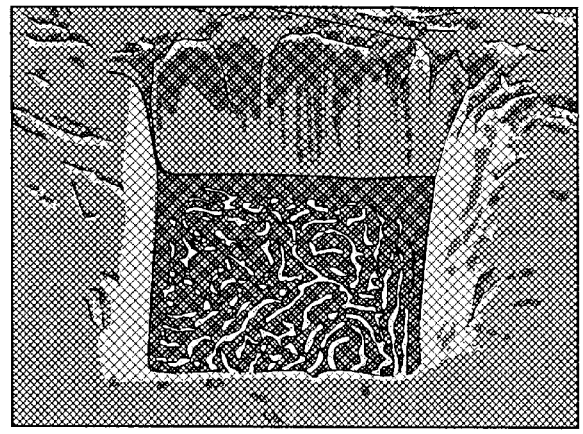
FIG. 4 shows an SEM micrograph, taken at 30 degree tilt, of $C_2H_4Cl_2$ chemical assisted FIB machined copper with 25 keV Ga$^+$, 0.5 nA, 130 nm spot size; 50% beam overlap, 0.1 usec dwell time showing very small waving topography and reduced redeposition.
Figure 5:
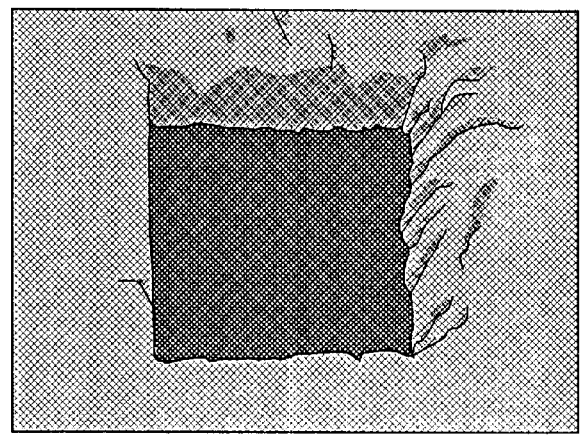
FIG. 5 shows an SEM micrograph, taken at 20 degree tilt, of $C_2Cl_4$, chemical assisted FIB machined copper with 25 keV Ga$^+$, 0.5 nA, 130 nm spot size; 50% beam overlap, and 0.1 usec dwell time, showing reduced topography and redeposition.
Figure 7:
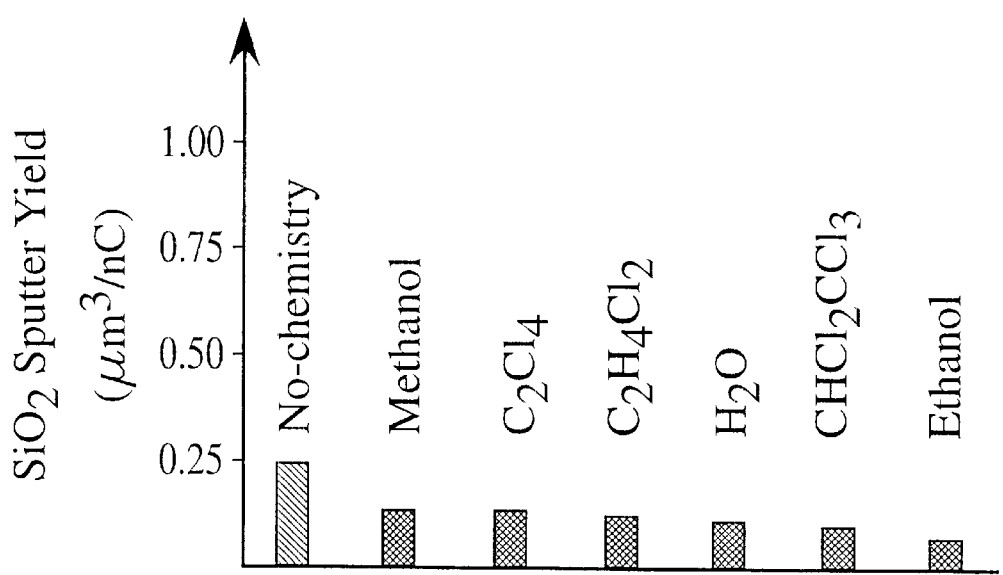
FIG. 7 shows a comparison between $SiO_2$ sputtering rates with some of the chemistries covered by this patent and one not—$H_2O$, and indicating ethanol as being currently preferred.
Figure 6:
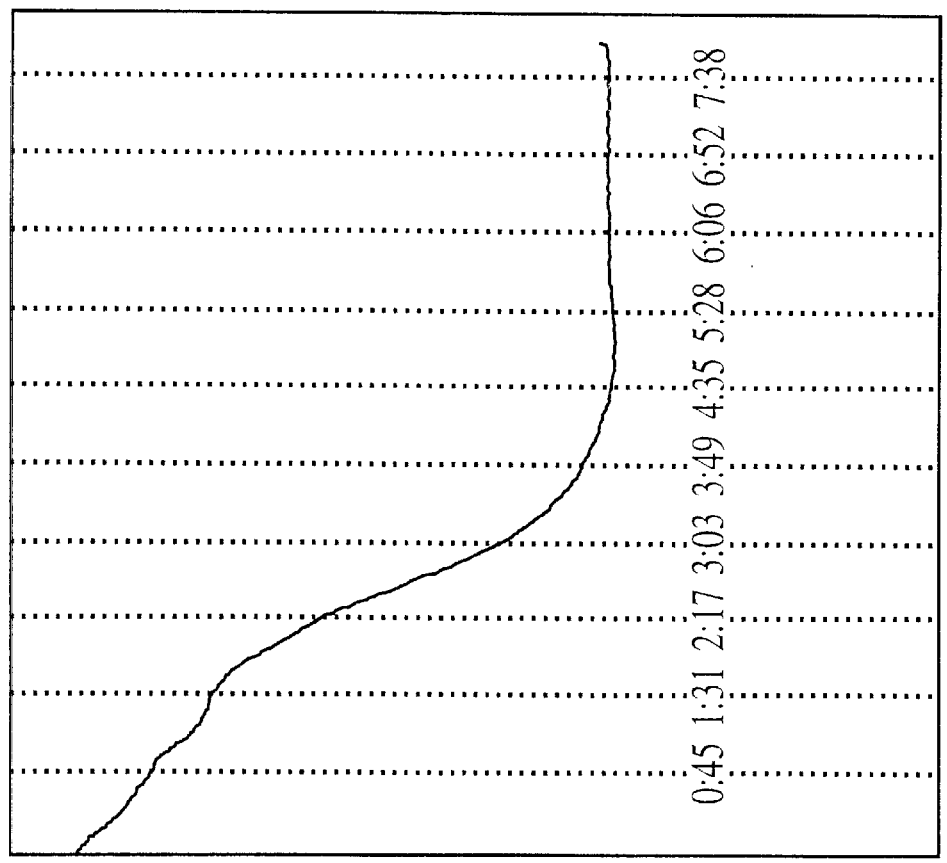
FIG. 6 shows SE vs. FIBM (0 to 9 min. 10 sec) obtained during FIBM of the crater in FIG. 5. SE emission stabilizes after removal of the copper. The copper layer is completely removed after 4 min, 35 sec.

In accordance with the present invention, the focused particle beam system of FIG. 1 is further provided with a source 46 for supplying organic chloride or organic hydroxide. The organic chloride or organic hydroxide may be provided in any suitable manner, preferably as a vapor. In a preferred embodiment, the organic chloride or organic hydroxide vapor is provided via a gas injection system, schematically illustrated in FIG. 2, and comprises a liquid reservoir 49 for the organic chloride or organic hydroxide, injection needle 50, leak valve 47, and shut-off valves 51. The organic chloride or organic hydroxide vapor is fed to the surface of the substrate or workpiece 22 through an injection needle 50 that is preferably positionable to within approximately 100 μm of the workpiece. The gas flow from the organic chloride or organic hydroxide vapor source 46 may be controlled, for example, using a variable leak valve 47, such as a Granville Phillips Series 203 valve, as would be known to those skilled in the art. Also, as would be known to those skilled in the art, the gas pressure at the entrance to the injector needle 50 may be monitored using a suitable vacuum gauge 48. For example, for a 0.5 mm outside diameter needle, a desirable flow rate through the needle would be approximately $2 \times 10^{-6}$ torr-liter/sec, yielding a pressure at the workpiece surface of approximately 1 mTorr, although, as would be understood by those having skill in the art, other flow rates and pressures at the surface of the workpiece 22 would be acceptable.

The present invention is useful, among other things, for design debug, editing and verification; metrology; and process control of microfabricated devices or substrates such as semiconductor substrates. In one embodiment, the present invention enhances the relative selectivity of removal of the copper material as compared to neighboring, adjacent or underlying second materials, such as an underlying dielectric. Thus, in one embodiment, the present invention provides the capability to stop etching at the interface (e.g., substantially precisely at the interface) between a copper layer and a second material (e.g., a dielectric) in a substrate. The present invention may provide for high resistance trace cutting for editing. In another embodiment, the present invention may provide for the substantial absence or reduction of re-deposition of residue from the etching process that spontaneously reacts upon exposure to air/water vapor.

The advantages of the present invention will be apparent from the information shown in FIGS. 3–7. Sputter induced roughness/topography, resulting from unassisted Focused Ion Beam Micromachining (FIBM) of 5×5 um$^2$ areas of a copper film, was found to be as as high as 50% for a sputtered copper depth of 2 um, typical of IC top metallization (see FIG. 3). This FIBM induced roughness resulted in an inability to completely clear copper in the micromachined areas without removing large amounts of dielectric. Thus stopping at the copper-barrier layer/dielectric interface as well as end point detection, by whatever means, was impossible. With $C_2H_4Cl_2$, chemically enhanced FIBM (CE-FIBM) increased the FIBM selectivity (defined as the material removal rate, in this case, of copper versus that of dielectric) between copper and dielectric and reduced the FIBM induced topography (see FIG. 4), but some topography was created. The use of $C_2Cl_4$ for CE-FIBM of copper resulted in a small increase in copper material removal rate (about 0.5 um$^3$/nC) and a significant reduction of FIBM induced topography at the copper-barrier layer/dielectric interface (see FIG. 5), providing a dramatic improvement in endpoint detection. (see FIG. 6). The improved ability to detect the endpoint by SE emission results from an increase in copper versus dielectric FIBM selectivity. The improvement in relative etch rates depends on both the enhancement of the copper etch rate as well as the retardation of the dielectric etch rate. Certainly the retardation is an important consideration (see FIG. 7). From voltage contrast imaging, the resistivity of a cut seems to meet what is required for trace cutting during editing operations. Further, after two weeks of exposure of the $C_2H_4Cl_2$ the $C_2Cl_4$ and the $C_2H_5OH$ CE-FIBM samples to "laboratory" air (about 30% humidity), no observable corrosion or reaction products were found.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of micromachining copper on a substrate, comprising the steps of:
   bombarding a portion of the copper with a charged particle beam from a particle source; and
   exposing the substrate to a supply of organic hydroxide during particle bombardment, the organic hydroxide concentration at the substrate being sufficient to enhance removal of the copper.

2. A method according to claim 1, wherein said substrate is a microelectronic substrate.

3. A method according to claim 1, wherein said charged particle beam is an ion beam.

4. A method according to claim 1, wherein said organic hydroxide is selected from the group consisting of $C_2H_5OH$, or $CH_3OH$.

5. A method of selectively removing a copper material from a substrate to expose a neighboring layer of a second material, the method comprising:
   maintaining the substrate in a vacuum;
   bombarding with a charged particle beam a portion of the substrate having a copper material neighboring a second material; and
   exposing the portion of the substrate to organic hydroxide during particle bombardment of the substrate, the copper layer having a sputter etch rate that is increased by the presence of organic hydroxide vapor and the second material having a sputter etch rate that is increased by the presence of organic hydroxide vapor at a lesser rate than that of the copper layer to the degree that the sputter etch rate of the copper material is relatively increased, thereby selectively sputtering the copper material compared with the second material.

6. The method of claim 5 in which the second material underlies the copper material.

7. The method of claim 5 in which exposing the substrate to a supply of organic hydroxide includes exposing the substrate to organic hydroxide vapor at a partial pressure of approximately 1 mTorr.

8. A method according to claim 5, wherein said charged particle beam is an ion beam.

9. A method according to claim 5, wherein the organic hydroxide is selected from a group consisting of $C_2H_5OH$ and $CH_3OH$.

10. The method of claim 5 in which the charged particle beam comprises a beam of gallium ions focused to a sub-micron target point.

11. The method of claim 5 in which the second material comprises a dielectric.

12. The method of claim 5 in which the second material comprises silicon dioxide.

13. The method of claim 5 in which exposing the substrate to a supply of organic hydroxide includes exposing the substrate though a gas injection needle.

14. A method of shaping features of a surface of a solid object having the surface, said method comprising the steps of:
   positioning said object within an enclosed chamber;
   supplying organic hydroxide vapor within said chamber so that organic hydroxide is adsorbed onto the exposed surface of said object for enabling an induced chemical reaction between the organic hydroxide and a copper layer at said surface;
   generating a focused particle beam; and
   directing said beam toward said surface for removal by sputtering of a portion of the copper layer, the particle-beam induced chemical reaction between the organic hydroxide and the copper layer increasing the sputtering rate of the copper layer relative to the sputtering rate of the surface.

15. The method of claim 14 in which the solid object comprises a microelectronic device.

16. A method according to claim 14, wherein said particle beam is an ion beam.

17. A method according to claim 14, wherein said organic hydroxide is selected from the group consisting of $C_2H_5OH$ and $CH_3OH$.

18. A method of chemically-enhanced particle beam machining of a copper layer surrounded by dielectric on a substrate for cross-sectional analysis, comprising:
   applying an organic hydroxide to the substrate; and
   bombarding with a focused particle beam a portion of the substrate including thereon a copper layer to expose for examination a cross section of the copper layer;

with said organic hydroxide applied to said substrate at a concentration sufficient to enhance removal of said copper layer relative to removal of the dielectric.

19. A method according to claim 18, wherein said organic hydroxide is selected from the group consisting of $C_2H_5OH$, and $CH_3OH$.

20. A method of selectively removing a copper material from a substrate to expose a neighboring layer of a second material, the method comprising:

maintaining the substrate in a vacuum;

bombarding with a charged particle beam a portion of the substrate having a copper material neighboring a second material; and exposing the portion of the substrate to organic hydroxide during particle bombardment of the substrate, the copper layer having a sputter etch rate that is decreased by the presence of organic hydroxide vapor and the second material having a sputter etch rate that is more greatly decreased by the presence of organic hydroxide vapor than that of the copper layer such that the sputter etch rate of the copper material is relatively increased, thereby selectively sputtering the copper material compared with the second material.

* * * * *